United States Patent

[11] 3,569,954

[72] Inventor Charles A. Glorioso
Chicago, Ill.
[21] Appl. No. 731,389
[22] Filed May 23, 1968
[45] Patented Mar. 9, 1971
[73] Assignee Teletype Corporation
Skokie, Ill.

[54] ANALOG COMMUTATOR
10 Claims, 5 Drawing Figs.

[52] U.S. Cl. .......... 340/347, 235/61.11
[51] Int. Cl. .......... H03k 13/00
[50] Field of Search .......... 340/347; 235/61.11

[56] References Cited
UNITED STATES PATENTS

| | | | |
|---|---|---|---|
| 3,242,479 | 3/1966 | Euler | 340/347 |
| 3,343,002 | 9/1967 | Ragland III | 340/347 |
| 3,366,804 | 1/1968 | Heaviside | 340/347 |
| 3,443,109 | 5/1969 | Broom | 235/61.115 |
| 3,458,689 | 7/1969 | Lynch | 340/347 |

*Primary Examiner*—Maynard R. Wilbur
*Assistant Examiner*—Jeremiah Glassman
*Attorneys*—J. L. Landis and R. P. Miller

ABSTRACT: An electronic commutator for converting low-level parallel binary input signals into an amplified, permutation-coded, serial-output, signal train includes a reference diode array and an input diode array, with the diodes of each of the arrays being variably reversed-biased, and with the diodes of the input array each being shunted by a reverse-connected photovoltaic cell. A staircase scanning voltage is applied to the diode arrays in the forward direction, and the diodes of each array conduct in a step-by-step fashion; but in the absence of any input signal causing a photovoltaic diode to conduct, the output of the reference array always is higher than that of the input array due to the manner in which the reverse-bias initially is adjusted. This causes a first output always to be obtained from an operational amplifier operated in its saturation-to-saturation mode and supplied with input signals from each diode array. Whenever a photovoltaic cell for a given level of the input array is illuminated, however, it generates sufficient current, when the diodes for that level of the two arrays are rendered conductive, to overcome the imbalance in favor of the reference array, causing a higher output voltage for that level to be obtained from the input array. This, in turn, causes a second output to be obtained from the operational amplifier. The output obtained from the operational amplifier, as a result, is a permutation-coded serial signal corresponding to the parallel signal applied to the photovoltaic diodes.

INVENTOR
CHARLES A. GLORIOSO
BY [signature]
ATTORNEY

ANALOG COMMUTATOR

BACKGROUND OF THE INVENTION

It is desirable to use photovoltaic diodes in photoelectric readers for reading perforated tape of the type commonly used in telegraph communications systems or for reading perforated cards. A problem exists in the use of such photovoltaic diodes, however, inasmuch as the outputs of the diodes are extremely low-level signals on the order to 25 to 50 microamps at 100 millivolts. In utilizing these low-level signal sources in a perforated tape reader of the type commonly employed in the printing telegraph art, it generally is necessary to provide for three different operations: first, serialization of the information (commutation), second, amplification of the outputs of the low-level input devices (photovoltaic diodes), and third, analogue to binary conversion (threshold detection of the diode outputs). These operations theoretically can be performed in any sequence; but in fact, the sequence used generally is determined by the hardware requirements. The sequence of processing used, in turn, determines the overall circuit cost of the equipment.

A conventional approach to the problem is to first amplify, then threshold detect and finally commutate the input signals. This approach requires that, for an 8-level parallel-coded input, the eight input signals each must be amplified by a stable amplifier. Then eight stable threshold detectors must be utilized operating at the same threshold, and finally the binary outputs of the threshold detectors must be serialized by digital techniques This approach to utilizing low-level input signal sources of the type provided by photovoltaic diodes is expensive and results in relatively complex circuits.

SUMMARY OF THE INVENTION

An analogue commutator employing parallel low-level signal inputs uses a reference array and an input array, each having a number of levels equal to the number of signal inputs. A stepped scanning voltage is applied to the arrays causing stepped output signals to be obtained therefrom. The output signals are supplied to a comparator which provides a first output when no low-level signal input for the level corresponding to a particular step is present, and which provides a second output when a low-level signal is present for the level associated with a step in a scanning voltage.

DETAILED DESCRIPTION

Figure 1:
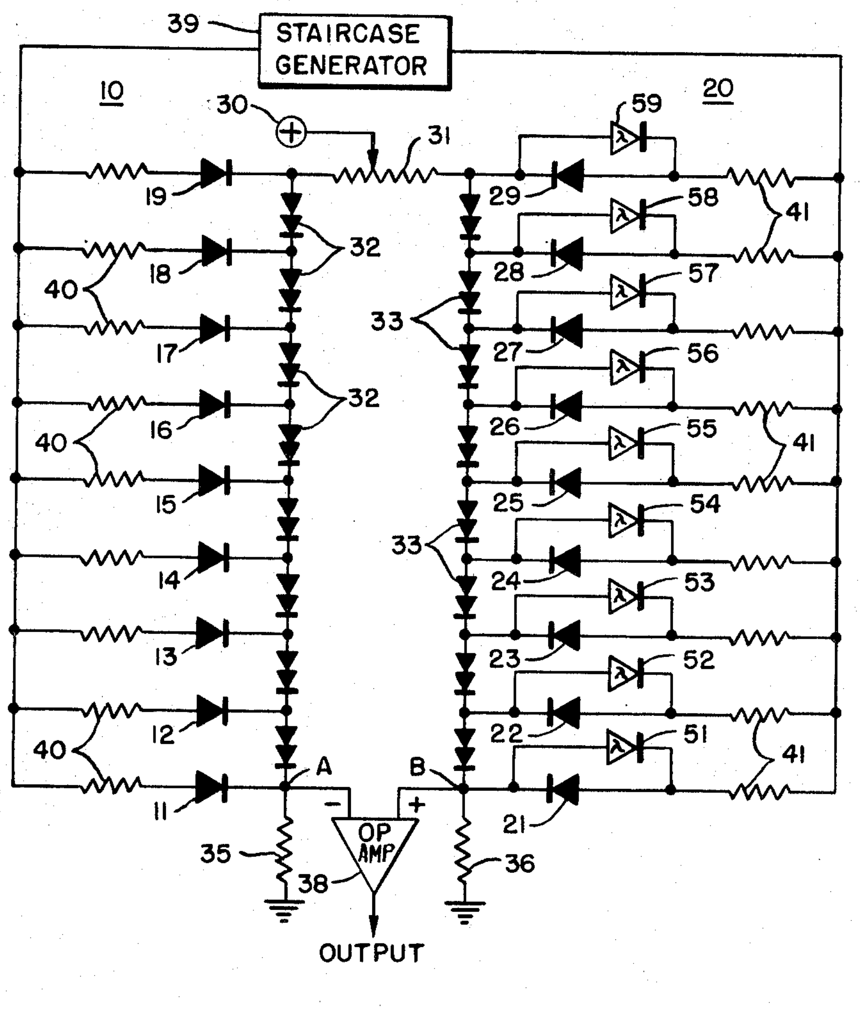
FIG. 1 is a circuit diagram of a preferred embodiment of the invention.

Referring now to the drawing and particularly to FIG. 1, there is shown a circuit diagram of a preferred embodiment of this invention. The analogue commutator, shown in FIG. 1, consists of a reference array 10, including nine silicon diodes 11 to 19 corresponding to the nine signal levels which can be obtained from the commutator, and an input array 20 also including nine diodes 21 through 29. The diodes 11 through 19 and 21 through 29 of both of the reference array and the input array are supplied with a biasing potential from a positive bias source 30 through a tapped resistor 31, the ends of which are connected respectively to two strings of double-junction silicon diodes 32 and 33. The diodes 32 are connected between the cathodes of each of the diodes 11 and 19 and the diodes 33 are connected between the cathodes of each of the diodes 21 through 29. Current flows through the diodes 32 and 33 in the forward direction toward ground, with the diode string including the diodes 32 being connected to ground through a resistor 35 and with the diode string including the diodes 33 being connected to ground through resistor 36. The resistors 35 and 36 are chosen to be of equal value, and the diodes 32 and 33 exhibit the characteristic of providing a substantially constant voltage drop thereacross, irrespective of the current flowing through them in the range of the currents used in the operation of the circuit.

From an examination of FIG. 1, it can be seen that the potentials applied to the cathodes of the diodes 11 through 19 and 21 through 29 back-biases these diodes in varying steps determined by the forward voltage drop across the double-junction diodes 32 and 33. The tapped resistor 31 is initially adjusted so that, in the absence of any other signals applied to the circuit, the voltage obtained at a junction point A connected to the resistor 35 is slightly higher than the potential obtained at a junction point B connected to the resistor 36. The junctions A and B are connected, respectively, to the two inputs of a differential-operational amplifier 38, which is operated in a saturation-to-saturation mode; so that whenever the input at terminal A is higher than the input at terminal B, the output of the amplifier 38 is a predetermined negative potential, and whenever the potential at terminal B is higher than that at terminal A, the output of the amplifier 38 switches to a predetermined positive potential.

Figure 2:
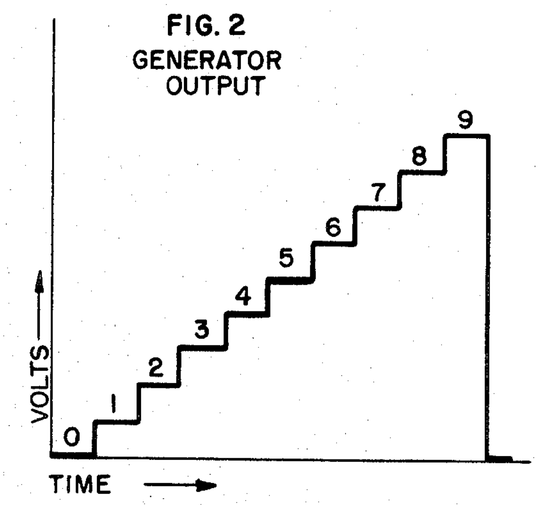
FIG. 2 is a waveform showing the scan source input signal.
Figure 3:
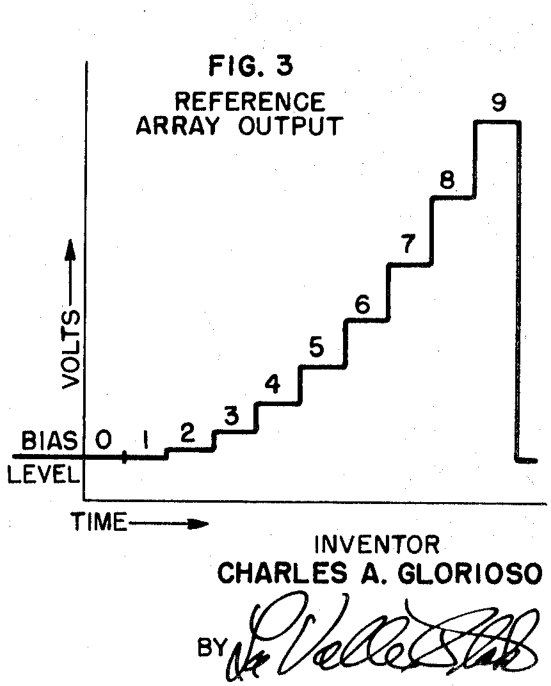
FIG. 3 shows the waveform of the output of the reference array obtained when the scan source signal, shown in FIG. 2, is applied to the array.

In order to use the device shown in FIG. 1 as a commutator, a conventional staircase generator 39 provides a stepped scan output signal, having a waveform as shown in FIG. 2, in parallel to all of the diodes 11 through 19 and 21 to 29 through suitable current limiting resistors 40 and 41 connected respectively to the diodes in the reference array 10 and the input array 20. The resistors 40 are of equal value and the resistors 41 are of equal value. The output signal obtained from the staircase generator 39 provides voltages in nine equal increments corresponding to the 8-levels of the desired permutation-code signal output followed by the conventional stop pulse associated with start-stop codes used in telegraphy. The voltage increments of the signals obtained from the output of the staircase generator 39 are chosen to be equal to the voltage increments of the varying biasing voltage applied to the cathodes of the diodes 11 through 19 and 21 to 29 by the voltage drops across the double-junction diodes 32 and 33. In the absence of any signal from the staircase generator 39, the output voltages appearing on terminals A and B are those due solely to the biasing of the diode strings 32 and 33 from the bias source 30. On step 1 of the output voltage from the generator 39, the anode and cathode of the diode 11 are at the same potential. The output of the staircase generator 39 applied to the input array 20 also is adjusted; so that on step 1, the anode and cathode of the diode 21 are at the same potential. Thus the output of the operational amplifier 38 continues to be negative, due to the fact that imbalance from the bias source 30 continues to cause the voltage at junction A to be higher than that appearing on junction B.

On the second step of the output of the generator 39, the diodes 11 and 21 are forward-biased and current flows from the staircase generator 39 through each of these diodes and through the resistors 35 and 36; but since this current is balanced, the imbalanced established by the bias source 30 continues to prevail, so that the potential at junction A remains higher than that of junction B. For each step in the voltage output obtained from the generator 39, an additional one of the diodes 12 through 19 and 22 through 29 in each of the arrays 10 and 20 is rendered conductive, causing increased current to flow through each of the resistors 35 and 36. In the absence of any other input signals, the potential at junction point A remains higher than the potential at junction point B due to the initial threshold imbalance established by the setting of a resistor 31, even though the total voltages at points A and B rise in amounts corresponding to the increased voltage obtained from the output of the staircase generator for each of the nine steps.

In order to use the circuit shown in FIG. 1 as an analogue commutator, each of the diodes 21 through 29 in the input array 20 is shunted by a reverse-connected photovoltaic diode 51 through 59. The photovoltaic diodes 51 through 59 are of the type which generate a low-level current at a low voltage in the reverse direction whenever they are illuminated. The maximum current generally is of the order of 50 microamps at approximately 100 millivolts. The threshold voltage established at the junction points A and B is adjusted by setting the tap on the resistor 31, so that a given diode 51 through 59 will affect the relative difference in the output potentials at the junction points A and B if it is illuminated to produce an output current of more than a predetermined amount, which for purposes of illustration may be considered to be 25 microamps. When no light impinges on one of the diodes 51 through 59, the diode acts essentially as an open circuit to the input signal supplied from the output of the staircase generator 39; so that a nonilluminated diode 51 to 59 has no affect on the circuit.

The photovoltaic diodes 51 through 59 may be utilized as output devices in a photoelectric perforated tape reader in which the diodes are illuminated in accordance with permutation-coded characters perforated in parallel across the tape, with a different combination of diodes being illuminated for each different character appearing on the tape being read. A tape reader or other suitable input device has not been shown in FIG. 1, since such readers are conventional and form no part of this invention.

Figures 4, 5:
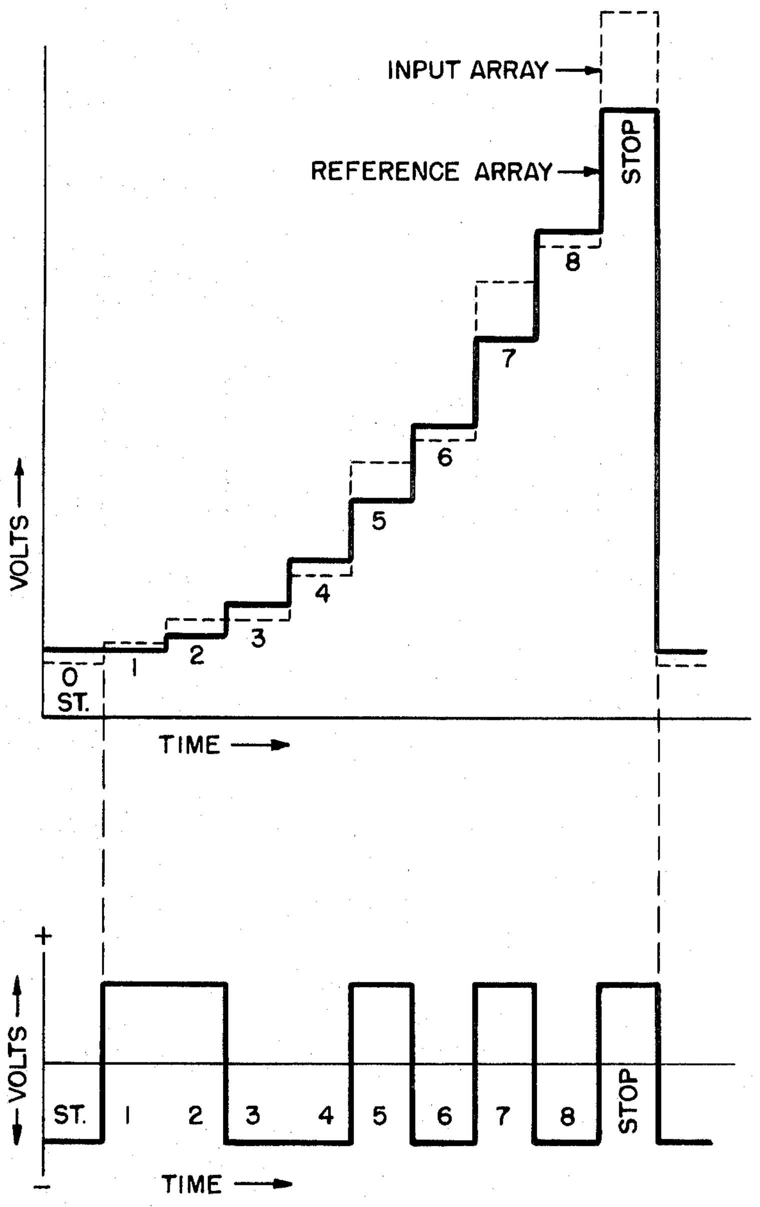
FIG. 4 shows the waveforms obtained from the reference array and the input array for a particular permutation-coded input signal.
FIG. 5 shows the output waveform obtained from the arrays providing the output signals indicated in FIG. 4.

For purposes of illustrating the manner in which the circuit operates, assume that the photovoltaic diodes 51, 52, 55, 57 and 59 are illuminated with sufficient light to cause them to produce more than 25 microamps of current; and that the photovoltaic diodes 53, 54, 56 and 58 are dark, that is, less than 25 microamps current is generated by these diodes. At time zero, as shown in FIG. 4, no output is obtained from the staircase generator 39; so that all of the diodes 11 through 19 and 21 through 29 are back-biased, causing the output of the operational amplifier 38 to be negative as shown in FIG. 5. This may be considered to be the start pulse of the permutation-coded character to be detected and commutated. At step 1 of the scan source output, the anodes and cathodes of the diodes 11 and 21 are at equal potentials, so that these diodes do not conduct. Since the photovoltaic diode 51, however, is illuminated, it is generating a current which shunts the diode 21 and is added to the current flowing into the junction point B and through the resistor 36 to ground. This additional current, provided by the illuminated photodiode 51, is sufficient to cause the voltage at junction point B to rise slightly above the voltage at junction point A established from the bias source. As a consequence, the output of the operational amplifier 38 rises to its positive value as indicated in FIG. 5. The relative outputs of the reference array and the input array at points A and B are indicated in FIG. 4 by the solid line and dotted line, respectively, for the particular example under consideration. At the next step of the output from the staircase generator 39, the diodes 11 and 21 are forward-biased with the potential at the anodes and cathodes of the diodes 12 and 22 being balanced. The photovoltaic diode 52, however, also is illuminated in an amount sufficient to overcome the imbalance provided to the arrays 10 and 20 by the setting of the resistor 31; so that enough increased current is supplied through junction point B and the resistor 36 to ground to cause the voltage at junction point B to remain slightly above the voltage on junction point A. Thus, the output of the operational amplifier remains positive as indicated in FIG. 5.

At the third step of the output from the generator 39, the diodes 22 and 12 are rendered conductive with the remainder of the diodes in the arrays 10 and 20 remaining nonconductive. Since the photodiode 53 is dark at this time, no current flows therethrough; and increased current flowing through the resistors A and B, due to the output of the staircase generator 39 added to the current obtained from the bias source, results in a voltage at junction A which is slightly higher than the voltage appearing at junction B; so that the output voltage obtained from the amplifier 38 once again becomes negative. As the output of the staircase generator 39 continues to increase, rendering the diodes for each of the successive steps in the arrays 10 and 20 conductive, the voltages at junctions A and B assume the relative characteristics indicated by the solid and dotted lines, respectively, shown in FIG. 4. Thus, at step 4 of the staircase generator output, the voltage at point A is higher than that at point B, since the photodiode 54 is illuminated. For step 5, the voltage at point B is higher than that at point A, since the photodiode 55 is illuminated, providing a sufficient amount of additional current to overcome the imbalance established by the initial setting of the resistor 31. It should be noted that since the double-junction silicon diodes 32 and 33 are operated in their forward current conducting directions, the increased current flowing through them for each step of the staircase generator output does not change the voltage drops across the diodes 32 and 33.

The photovoltaic diode 59 is always illuminated in the normal operation of this commutator, since this diode is the one associated with the stop pulse added to the end of the permutation-coded signal obtained from the photodiodes 51 through 58. As a consequence, when step 9 of the output from the staircase generator 39 is reached, the output of the operational amplifier 38 becomes or remains positive for each cycle of operation of the staircase generator 39. This output voltage from the staircase generator 39 at step 9 also should be maintained as the stop condition until the next character is to be transmitted from the output of the operational amplifier 38. When transmission of the next character is to resume, the output of the staircase generator drops to zero, and the cycle is repeated.

From the foregoing, it may be seen that the reference array 10 and input array 20 perform the commutation of the signal obtained from the photovoltaic diodes 51 through 59 under control of the staircase generator 39. Amplification and threshold detection of the output signals are performed simultaneously by the operational amplifier 38, with the threshold level being determined by the balance between the outputs of the reference array 10 and the input array 20 as established by the initial setting of the resistor 31.

Although the invention has been described in the foregoing specification and is shown in the drawing in conjunction with a particular embodiment, it is to be understood that the invention is not limited to that specific embodiment, but covers all changes and modifications which do not constitute departures from the true scope of the invention.

I claim:

1. An electronic commutator for converting low-level parallel binary input signals into amplified, permutation-coded, serial-output, signal trains including:

a reference array having a plurality of parallel-connected unidirectional current conducting devices;

an input array having a plurality of parallel-connected unidirectional current conducting devices;

means for providing a variable biasing voltage in the reverse direction across the devices of each of the arrays;

signal-responsive current-generating means connected across each of the devices of the input array for generating a current in response to input signals;

means for applying a variable scanning voltage to the devices of the arrays in the forward-current conducting direction for overcoming the biasing voltage to cause the devices of each array to conduct in a step-by-step fashion; and a signal comparator connected to the outputs of the arrays for comparing the signal levels obtained from each of said arrays, and producing an output signal indicative of the relative difference between the signals obtained from said arrays.

2. An electronic commutator in accordance with claim 1 in which the signal response means are photovoltaic diodes.

3. An electronic commutator in accordance with claim 1 wherein the variable reverse-biasing means causes the output of the reference array to be at a threshold which is higher than that of the input array in the absence of any input signals applied to the signal responsive means.

4. An electronic commutator in accordance with claim 1 wherein the means for applying the scanning voltage to the arrays is a staircase oscillator.

5. An electronic commutator in accordance with claim 1 wherein the means for comparing the output signals of the arrays is an operational amplifier operated in its saturation-to-saturation mode for producing a binary output signal indicative of the instantaneous relative difference between the outputs of the arrays.

6. An analogue commutator including:

a source of scanning voltage;

a reference array having a plurality of unidirectional current conducting devices connected in parallel with the source of scanning voltage;

an input array having a plurality of unidirectional current conducting devices connected in parallel with the source of scanning voltage;

means for variably back-biasing all of the unidirectional current conducting devices in both of the arrays, said variable bias being adjusted to provide a higher back-bias to the unidirectional current conducting devices in the reference array;

means for applying the scanning voltage in the forward direction across all of the unidirectional current conducting devices in both of the arrays for overcoming the back-bias applied to the arrays by the variable bias means in a step-by-step fashion;

means, responsive to input signals, connected across each of the unidirectional current conducting devices in the input array for generating a current in the forward direction across the unidirectional current conducting devices in an amount sufficient to overcome the imbalance provided by the bias means; and means for comparing the output signals obtained from both of said arrays to provide an output indicative of the relative difference in the output signals obtained from the arrays.

7. An analogue commutator in accordance with claim 6 wherein the scanning voltage is a staircase voltage generated by a staircase oscillator.

8. An analogue commutator in accordance with claim 6 wherein the unidirectional current conducting devices are diodes.

9. An analogue commutator in accordance with claim 6 wherein said signal responsive means are photovoltaic cells.

10. An analogue commutator in accordance with claim 6 wherein said means for comparing the output signals obtained from the arrays is a differential operational amplifier.